United States Patent
Lin et al.

(10) Patent No.: US 9,331,168 B2
(45) Date of Patent: May 3, 2016

(54) SEMICONDUCTOR STRUCTURE AND MANUFACUTURING METHOD OF THE SAME

(71) Applicant: TAIWAN SEMICONDUCTOR MANUFACTURING COMPANY LTD., Hsinchu (TW)

(72) Inventors: Su-Horng Lin, Hsinchu (TW); Lin-Jung Wu, Miaoli County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/158,368

(22) Filed: Jan. 17, 2014

(65) Prior Publication Data
US 2015/0206951 A1    Jul. 23, 2015

(51) Int. Cl.
| | |
|---|---|
| H01L 21/00 | (2006.01) |
| H01L 29/00 | (2006.01) |
| H01L 29/51 | (2006.01) |
| H01L 21/28 | (2006.01) |
| H01L 21/324 | (2006.01) |
| H01L 21/02 | (2006.01) |
| H01L 29/423 | (2006.01) |
| H01L 21/268 | (2006.01) |
| H01L 21/3105 | (2006.01) |

(52) U.S. Cl.
CPC ........ *H01L 29/517* (2013.01); *H01L 21/02345* (2013.01); *H01L 21/02356* (2013.01); *H01L 21/2686* (2013.01); *H01L 21/28158* (2013.01); *H01L 21/3105* (2013.01); *H01L 21/324* (2013.01); *H01L 29/42364* (2013.01)

(58) Field of Classification Search
CPC .............. H01L 21/28158; H01L 21/2686; H01L 21/324; H01L 21/02356; H01L 29/517; H01L 29/42364; H01L 29/513; H01L 21/3105; H01L 21/02345
USPC .......... 257/411, 325, 310; 438/591, 585, 778, 438/785
See application file for complete search history.

(56) References Cited

U.S. PATENT DOCUMENTS

| | | | |
|---|---|---|---|
| 6,573,197 B2 * | 6/2003 | Callegari et al. ............. | 438/791 |
| 7,002,788 B2 * | 2/2006 | Jeong ....................... | H01G 4/10 257/310 |
| 7,183,604 B2 * | 2/2007 | Cartier et al. ................ | 257/310 |
| 7,564,108 B2 * | 7/2009 | Wang et al. .................. | 257/410 |
| 8,476,155 B1 * | 7/2013 | Lim et al. ...................... | 438/584 |
| 8,518,783 B2 * | 8/2013 | Mueller et al. ................ | 438/287 |

(Continued)

OTHER PUBLICATIONS

Sze, "Semiconductor Devices" 1985, John Wiley & Sons, pp. 32-33.*

*Primary Examiner* — Nikolay Yushin
(74) *Attorney, Agent, or Firm* — Chun-Ming Shih

(57) ABSTRACT

Some embodiments of the present disclosure provide a semiconductor structure. The semiconductor structure includes a substrate, a high k dielectric layer disposed over the substrate, and a gate layer over the high k dielectric layer. The high k dielectric layer is partially crystallized and comprising an average thickness of from about 10 Å to about 30 Å. Some embodiments of the present disclosure provide a method for manufacturing a semiconductor structure. The method includes (i) forming a high k dielectric layer with a thickness of from about 10 Å to about 30 Å over a substrate, (ii) forming a gate layer over the dielectric layer, and (iii) transforming at least a portion of the dielectric layer from a first phase to a second phase by microwave irradiation.

20 Claims, 15 Drawing Sheets

(56) References Cited

U.S. PATENT DOCUMENTS

| | | | |
|---|---|---|---|
| 8,546,862 B2 * | 10/2013 | Golubovic | 257/298 |
| 8,735,243 B2 * | 5/2014 | Copel et al. | 438/216 |
| 8,952,462 B2 * | 2/2015 | Chen et al. | 257/411 |
| 2002/0151142 A1 * | 10/2002 | Callegari et al. | 438/287 |
| 2003/0183885 A1 * | 10/2003 | Nishikawa et al. | 257/410 |
| 2004/0121566 A1 * | 6/2004 | Laibowitz et al. | 438/482 |
| 2005/0224897 A1 * | 10/2005 | Chen et al. | 257/410 |

\* cited by examiner

SEMICONDUCTOR STRUCTURE AND MANUFACUTURING METHOD OF THE SAME

BACKGROUND

The semiconductor integrated circuit (IC) industry has experienced rapid growth. Technological advances in IC materials and design have produced generations of ICs where each generation has smaller and more complex circuits than the previous generation. These advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down also presents critical challenges for manufacturing and processing IC devices having gate stacks, such as reducing effective/equivalent oxide thickness (EOT) while keeping gate leakage under control.

Accordingly, what is needed is a method for making a semiconductor device that addresses the above stated issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
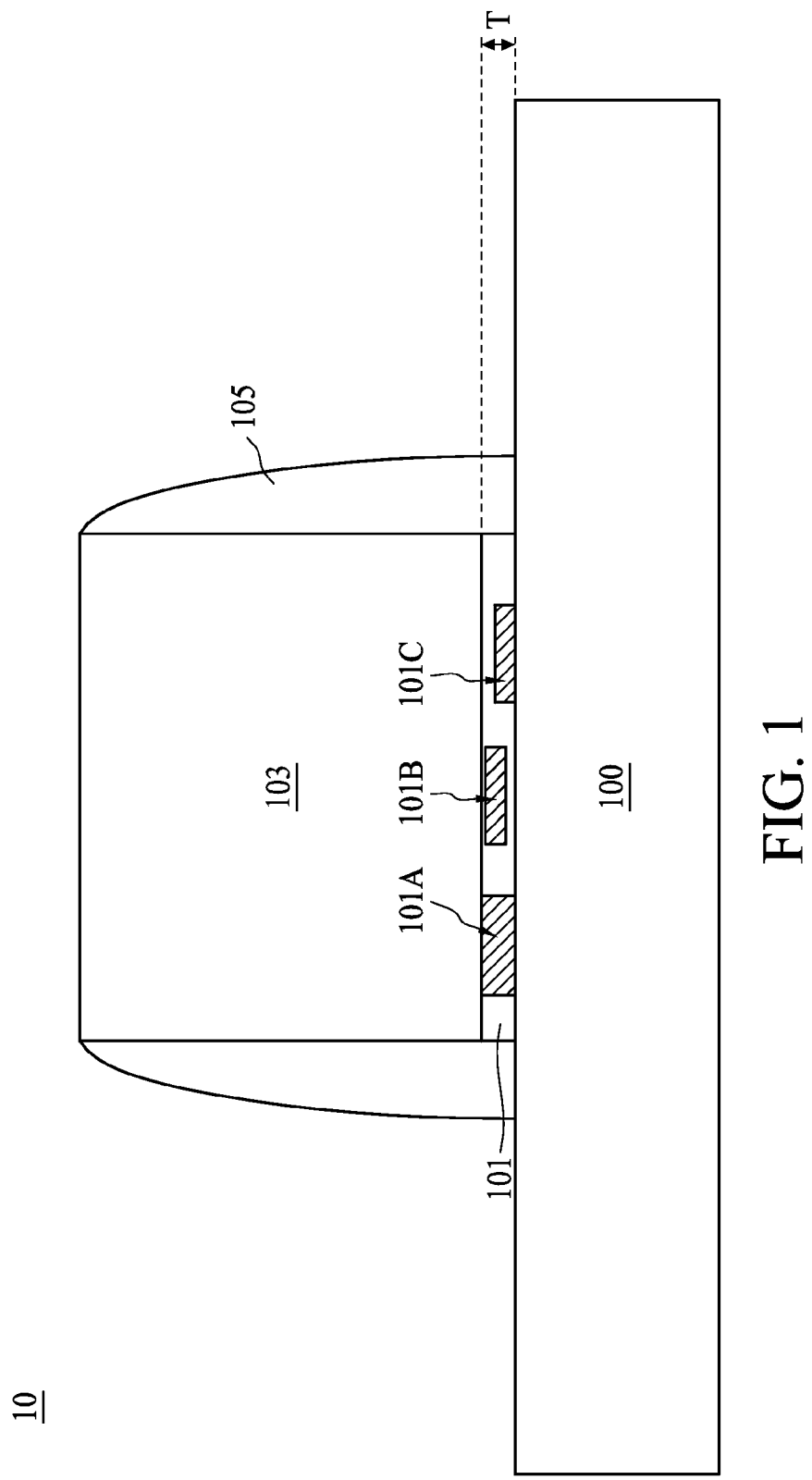
FIG. 1 and FIG. 2 show cross sectional views of a semiconductor structure with partially crystallized gate dielectric layer, in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

DEFINITION

As used herein, a "substrate" refers to an elementary semiconductor including silicon or germanium in crystal, polycrystalline, or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or combinations thereof. A "substrate" herein also includes the alloy semiconductor substrate having a gradient SiGe feature in which the Si and Ge composition change from one ratio at one location to another ratio at another location of the gradient SiGe feature. A "substrate" herein also includes a strained SiGe formed over a silicon substrate. Furthermore, the A "substrate" herein may be a semiconductor on insulator, such as a silicon on insulator (SOI), or a thin film transistor (TFT).

As used herein, "k value" refers to the relative permittivity of a material at room temperature under a frequency of 1 kHz. The relative permittivity of a material under the above condition is a ratio of the amount of electrical energy stored in a material by an applied voltage, relative to that stored in a vacuum. In other words, it is also the ratio of the capacitance of a capacitor using that material as a dielectric, compared to a similar capacitor that has a vacuum as its dielectric. Under the above condition, silicon dioxide has a k value of 3.9. The "high k value" and/or the "higher k value" addressed in the present disclosure refer to the k value greater than that of 3.9.

Similarly, the "low k value" and/or the "lower k value" addressed in the present disclosure refer to the k value lower than or equal to that of 3.9.

As used herein, a "high k dielectric layer" refers to a dielectric layer with a high k value, including hafnium oxide ($HfO_2$), hafnium silicon oxide (HfSiO), hafnium silicon oxynitride (HfSiON), hafnium tantalum oxide (HMO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, other suitable high-k dielectric materials, and/or combinations thereof.

As used herein, a "gate layer" refers to a gate composed of dielectric material, such as silicon-containing materials including polycrystalline silicon, silicon nitride, silicon oxynitride, and silicon carbide; germanium-containing materials; other suitable dielectric materials; and/or combinations thereof. A "gate layer" herein also refers to a gate composed of conductive material, such as aluminum, copper, tungsten, titanium, tantalum, titanium nitride, tantalum nitride, nickel silicide, cobalt silicide, TaC, TaSiN, TaCN, TiAl, TiAlN, other suitable materials, and/or combinations thereof.

As transistor technology scales from 40 nm to 28 nm node, the requirement for the k value of the gate dielectric becomes more stringent in order to maintain the EOT and prevent the leakage current which causes high power consumption and reduced device reliability. For example, hafnium dioxide ($HfO_2$) is a well-known candidate to replace silicon dioxide for the gate dielectric in the next generation device, having a k value of 25. However, the requirement for an even higher k value persists when the transistor further scales from 28 nm down to 20 nm or 16 nm node. Instead of seeking for other dielectric materials with higher k value, changing the crystal phase of a dielectric material can substantially raise or lower the k value. For instance, an amorphous $HfO_2$ possesses a k value of about 20, whereas a cubic $HfO_2$ possesses a k value of about 26, and a tetragonal $HfO_2$ possesses a k value of about 29. In this regard, one can effectively increase the k value of the gate dielectric without changing the fundamental materials but to induce a phase change of the dielectric material.

The as-deposited $HfO_2$ can be in an amorphous phase. An annealing operation can be conducted to induce the crystal rearrangement of the amorphous $HfO_2$ and thus increase the crystallinity thereof. For example, a layer of 45 Å-$HfO_2$ can transform from an amorphous phase to a polycrystalline phase by applying an annealing operation at 750 degrees Celsius. Next generation device may require a thermal treatment with a temperature ranging between about 1200 to about 1300 degrees Celsius, whereas a normal gate stack can only withstand temperatures over about 800 degrees Celsius for only a few milliseconds. The annealing operation imposes a great thermal budget in both a micro and a macro perspective. Microscopically, the heating operation (i.e., thermal energy processes) generates interlayer diffusions in the gate stack especially when a metal gate structure coexists with the high k value gate dielectric. When manufacturing devices having high-k/metal gate stacks, a trade-off occurs between providing sufficient energy for annealing the gate stacks' layers and preventing interlayer diffusion. In the macroscopic viewpoint, the mismatch of the coefficient of thermal expansion (CTE) between different materials induces stresses which severe the wafer sagging problems as a result of applying high thermal stress. The wafer sagging problem is more prominent with the increased wafer size, for example, a 450 mm wafer which is to be used in the next generation technology. The annealing processes typically require higher temperatures for preferably longer lengths of time, while maintaining the functionality of the gate stacks requires lower temperatures for shorter lengths of time.

Overall, inducing a crystal phase transformation by thermal heating creates foreseeable wafer sagging and interlayer diffusion problems. Some embodiments of the present disclosure provide a selective heating operation which only a predetermined layer is heated in the semiconductor structure and said energy is sufficient to generate a phase transformation in the predetermined layer. In some embodiments, a microwave radiation treatment with specific ranges of frequencies is applied to the semiconductor structure. The specific ranges of frequencies are chosen to induce vibration and/or rotation of the molecular bonds of the polar materials (i.e., dielectric materials) in the semiconductor structure.

In some embodiments of the present disclosure, a microwave radiation treatment is introduced into the processing sequence of semiconductor devices and is applied to the gate stacks of the semiconductor devices. By applying a microwave radiation treatment, electromagnetic waves oscillate molecules of a target material, uniformly heating the entire volume of the target material from within (i.e., volumetrically heating). Absorption of the microwave energy depends strongly on the intrinsic properties (e.g., a dielectric loss factor) of the material. When tuned to a particular microwave frequency, the microwave energy will be absorbed at only the target layer of the gate stack, while the other layers in the gate stack remain unaffected.

FIG. 1 shows a gate portion of a semiconductor transistor structure 10 according to some embodiments of the present disclosure. The semiconductor transistor structure 10 includes a substrate 100, a high k dielectric layer 101 having a thickness T of from about 10 Å to about 30 Å positioned over the substrate 100, and a gate layer 103 disposed over the high k dielectric layer 101. Optionally a sidewall spacer 105 can be surrounding the gate stack (i.e., including at least the high k dielectric layer 101 and the gate layer 103). As can be seen in FIG. 1, several portions (101A, 101B, 101C) of the high k dielectric layer 101 are crystallized, whereas other portions of the high k dielectric layer 101 are either amorphous or have certain short range orders which do not constitute crystalline structures. In some embodiments, each of the crystallized portions (101A, 101B, 101C) can be single crystalline or polycrystalline, and the area occupied the crystallized portion can be spreading from a top surface to a bottom surface of the high k dielectric layer 101 (such as portion 101A), situating in the middle of the high k dielectric layer 101 (such as portion 101B), or in connection with only one surface of the high k dielectric layer 101 (such as portion 101C). The shape of the crystallized portion (101A, 101B, 101C) can be irregular and the size of each crystallized portion has no correlation to each other.

Figure 2:
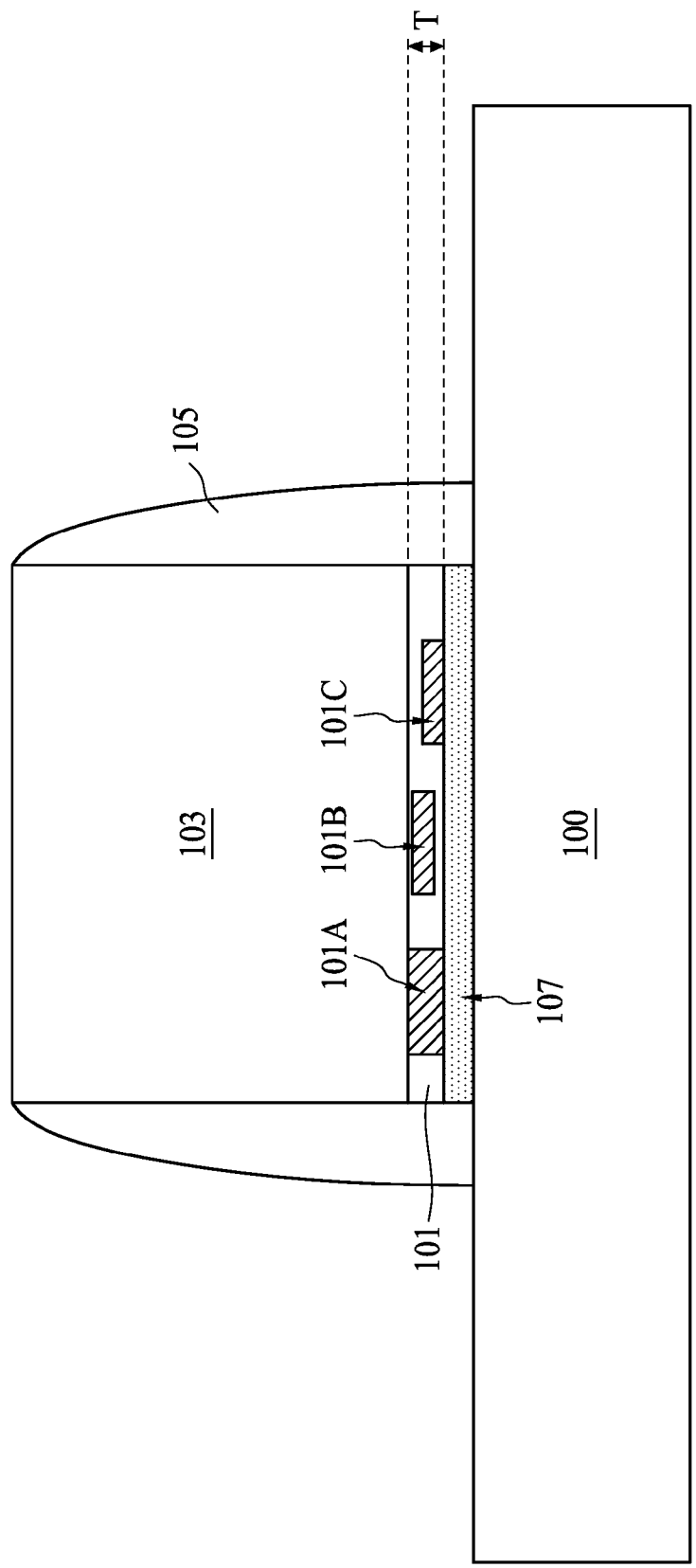

FIG. 2 shows a gate portion of a semiconductor transistor structure 20 according to some embodiments of the present disclosure. Elements in FIG. 2 sharing the same numeral labels with those in FIG. 1 are referred to the same elements or their equivalents and are not repeated here for simplicity. In FIG. 2, an interfacial layer 107 is positioned between the high k dielectric layer 101 and the substrate 100. In some embodiments, the interfacial layer 107 is the native oxide of the substrate 100. In other embodiments, the interfacial layer 107 is a deposited oxide layer with few electronic defects which forming good interface with the substrate 100. In some embodiments, the interfacial layer 107 may include a grown $SiO_2$ layer and/or further include SiON. However, the interfacial layer 107 can be omitted as long as the interface can be formed between the substrate 100 and the high k dielectric layer 101 does not deteriorate a normal electrical performance of the device.

As can be seen in FIG. 2, crystallized portions (101A, 101B, 101C) can be found in the high k dielectric layer 101 instead of from the interfacial layer 107. Although in some embodiments the high k dielectric layer 101 and the interfacial layer 107 are both composed of insulator, the polarities between the high k dielectric layer 101 and the interfacial layer 107 are different, and hence different energy bands are to be absorbed by the two layers. In other words, a particular microwave frequency can be selectively absorbed by the high k dielectric layer 101 but by the interfacial layer 107, causing the occurrence of selective heating in the high k dielectric layer 101. In some embodiments, the interfacial layer 107 is amorphous and the high k dielectric layer 101 is at least partially crystallized.

In FIG. 2, the crystallized portions (101A, 101B, 101C) in the high k dielectric layer 101 possess more than one crystal structures. In some embodiments, the portion 101A is cubic whereas the portions 101B and 101C are tetragonal. However, the crystallized portions (101A, 101B, 101C) can be of same crystal structure. In some embodiments, the high k dielectric layer 101 can be uniformly crystallized with only a single tetragonal phase.

Figure 3:
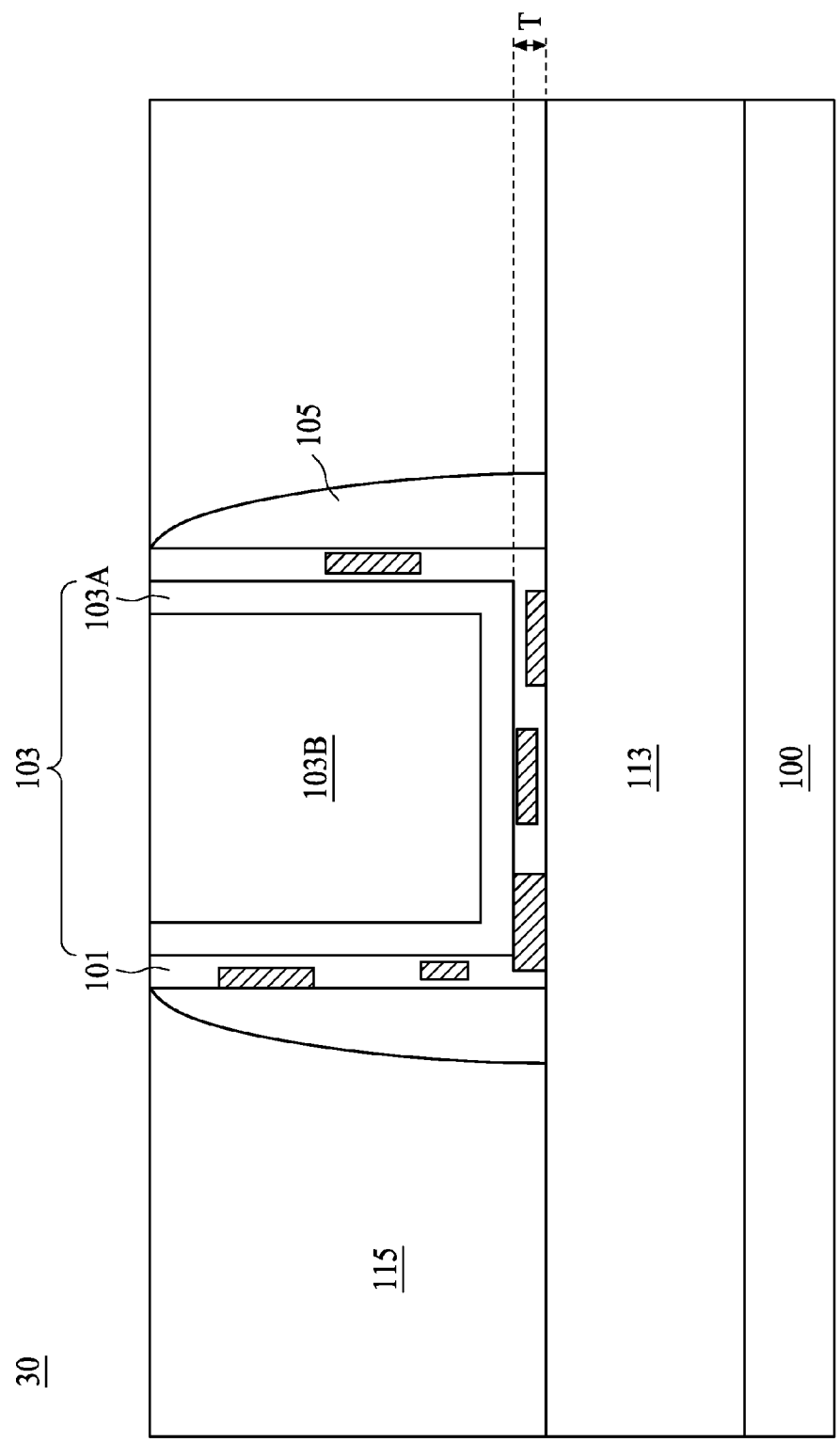
FIG. 3 and FIG. 4 show cross sectional views of a semiconductor structure having a metal gate with partially crystallized gate dielectric layer, in accordance with some embodiments of the present disclosure.

FIG. 3 shows a gate portion of a semiconductor transistor structure 30 having a metal gate according to some embodiments of the present disclosure. Elements in FIG. 3 sharing the same numeral labels with those in FIG. 1 and FIG. 2 are referred to the same elements or their equivalents and are not repeated here for simplicity. In FIG. 3, the gate layer 103 is a metal gate which includes at least a gate fill metal layer 103B and a work function metal layer 103A. In some embodiments, the semiconductor transistor structure 30 is a FinFET metal gate structure. The gate layer 103 in FIG. 3 is positioned over a semiconductor fin 113 and the substrate 100. In some embodiments, the gate layer 103 may further include liner layers, interface layers, seed layers, adhesion layers, barrier layers, or the like. For example, if a P-type work function metal (P-metal) for a PMOS device is desired, TiN, WN, or W may be used. On the other hand, if an N-type work function metal (N-metal) for NMOS devices is desired, TiAl, TiAlN, or TaCN, may be used. In some embodiments, the metal gate may include doped-conducting metal oxide materials.

An interlayer dielectric (ILD) 115 surrounding the metal gate and is disposed on the semiconductor fin 113. As previously discussed, although the high k dielectric layer 101 and the ILD 115 are both composed of insulator, the polarities between the high k dielectric layer 101 and the ILD 115 are different, and hence different energy bands are to be absorbed by the two layers. Referring to FIG. 3, a horizontal part of the high k dielectric layer 101 is situated between the gate layer 103 and the semiconductor fin 113 and a vertical part of the high k dielectric layer 101 is also formed between the sidewall spacer 105 and the gate layer 103. In some embodiments, the crystallized portions (shaded area in the high k dielectric layer 101) can be formed throughout the high k dielectric layer 101.

Figure 4:
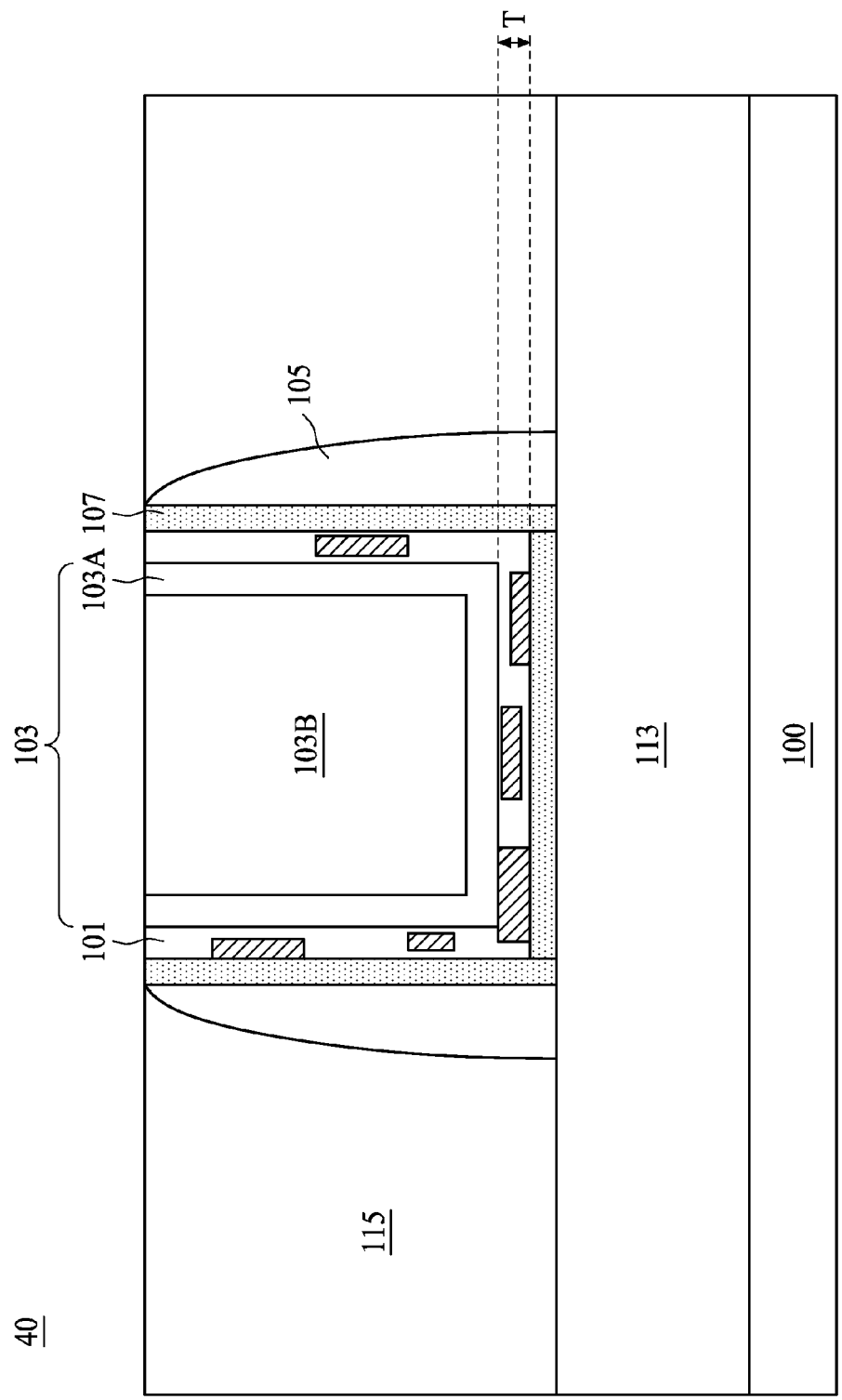

FIG. 4 shows a gate portion of a semiconductor transistor structure 40 with a metal gate and a FinFET structure according to some embodiments of the present disclosure. Elements in FIG. 4 sharing the same numeral labels with those in FIG. 1 to FIG. 3 are referred to the same elements or their equivalents and are not repeated here for simplicity. Because the crystallized portions (shaded area in the high k dielectric layer 101) of the high k dielectric layer 101 are formed by microwave selective heating operation, interlayer diffusion can be prevented in the metal gate layers having fine thicknesses in the order of tens of Angstrom.

Figure 5:
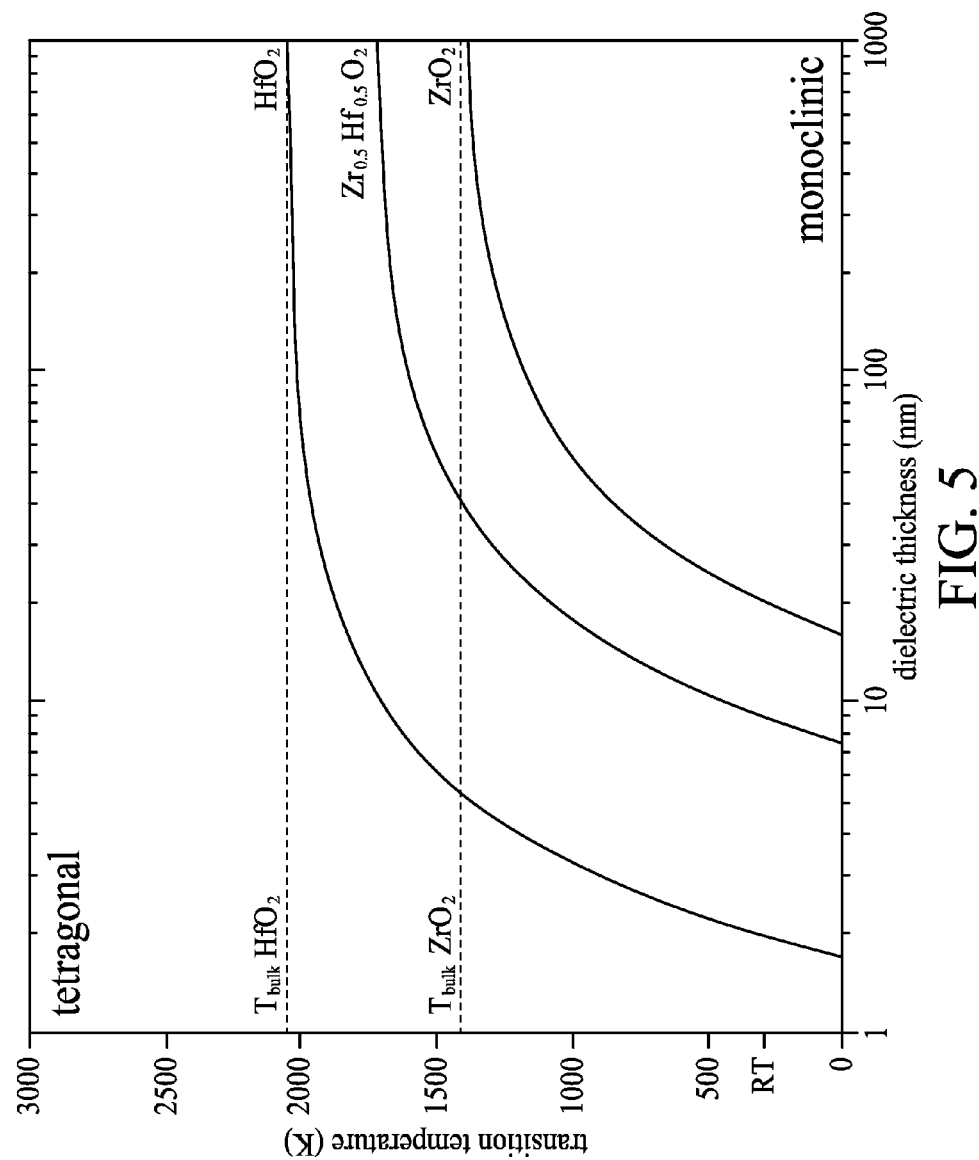
FIG. 5 is a diagram showing the relationship between crystal phase transition temperatures at different dielectric thicknesses.

FIG. 5 is a log-log plot showing a relationship between the dielectric thickness and the crystal phase transition temperature (hereinafter "transition temperature"). Three curves are shown in the plot, representing the above-mentioned relationship in high k dielectric materials of $HfO_2$, $Zr_{0.5}Hf_{0.5}O_2$, and $ZrO_2$, respectively. As shown in FIG. 5, the transition temperature reaches a saturation value when the thickness of the dielectric layer is greater than 1000 nm. In one example, the bulk $ZrO_2$ transition temperature is close to 1500K, whereas a 20 nm $ZrO_2$ layer has a transition temperature of about room temperature (300K). In another example, the bulk $HfO_2$ transition temperature is more than 2000K, whereas a 2 nm $HfO_2$ layer has a transition temperature of about room temperature. As can be seen in the log-log plot that the transition temperature of $Zr_{0.5}Hf_{0.5}O_2$ situates between the $ZrO_2$ curve and the $HfO_2$ curve.

Referring to FIG. 5, the lower right corner of the plot represents a thick film at low temperature. The high k dielectric materials $HfO_2$, $Zr_{0.5}Hf_{0.5}O_2$, and $ZrO_2$ under these conditions often possess monoclinic crystal structure. In contrast, the upper left corner of the plot represents a thin film at high temperature, and the high k dielectric materials $HfO_2$, $Zr_{0.5}Hf_{0.5}O_2$, and $ZrO_2$ under these conditions possess tetragonal crystal structure. Because in the next generation device a gate dielectric thinner than 2 nm is required, when a temperature imposed on the high k dielectric layer is raised to about 900K (i.e. 627 degrees Celsius), a $HfO_2$ layer can be transformed from monoclinic to tetragonal, and a 45% of k value increase can be expected.

Figure 6:
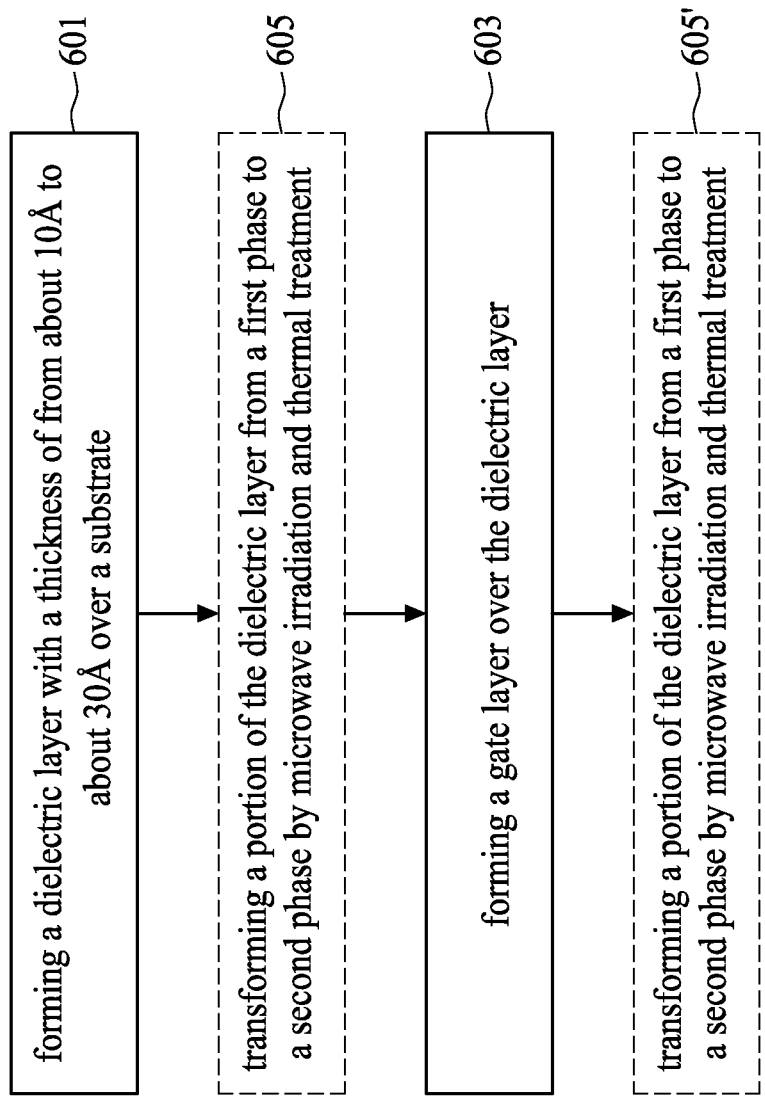
FIG. 6 shows operations in a method for manufacturing a semiconductor structure with a partially crystallized dielectric layer, in accordance with some embodiments of the present disclosure.

FIG. 6 shows operation procedures of a method for manufacturing a semiconductor structure. The method includes operation 601 forming a dielectric layer with a thickness of from about 10 Å to about 30 Å over a substrate and operation 603 forming a gate layer over the dielectric layer. A transforming operation 605 which transforms a portion of the dielectric layer from a first phase to a second phase by microwave irradiation and thermal treatment, illustrated in a box with dotted boundary, can either apply before or after the operation 603 forming a gate layer over the dielectric layer.

In some embodiments, the operation 601 forming a dielectric layer with a thickness of from about 10 Å to about 30 Å over a substrate includes an atomic layer deposition (ALD) operation having sub-cycles of a Hf source pulse and an oxygen source pulse (e.g., $HfCl_4$ and $H_2O$ respectively) to form an Hf—O layer (e.g., $HfO_x$ such as $HfO_2$). The ALD operation may include an $N_2$ carrier gas and be interposed by one or more purge process(es). A purge may follow the hafnium source pulse before introducing the oxygen source pulse. A purge may also follow the oxygen source pulse where reaction products and/or excess reactants are purged from the chamber. In some embodiments, any suitable number of sub-cycles of a Hf source pulse and an oxygen source pulse may be adopted to form a $HfO_2$ layer having a thickness of from about 10 Å to about 30 Å thickness. In some embodiments, the $HfO_2$ layer deposited by an ALD operation is amorphous.

In some embodiments, the operation 603 forming a gate layer over the dielectric layer includes forming a polysilicon gate or a metal gate. The gate layer may be formed by conventional deposition, photolithography patterning, and etching processes, and/or combinations thereof. The deposition processes may include PVD, CVD, ALD, PECVD, RPCVD, MOCVD, sputtering, plating, other suitable methods, and/or combinations thereof. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint. The etching processes may include dry etching, wet etching, and/or other etching methods (e.g., reactive ion etching). The etching process may also be either purely chemical (plasma etching), purely physical (ion milling), and/or combinations thereof.

In some embodiments, the metal gate may be formed using a "gate first" or a "gate last" operation (e.g., including a sacrificial polysilicon gate). The metal gate may be formed by any suitable process to any suitable thickness, such as ALD, CVD, PVD, RPCVD, PECVD, MOCVD, sputtering, plating, other suitable processes, and/or combinations thereof.

In some embodiments, operation 605 which transforms a portion of the dielectric layer from a first phase to a second phase by microwave irradiation and thermal treatment may include a separate annealing operation and a microwave irradiation or apply the annealing operation and the microwave irradiation at the same time. In some embodiments, a thermal treatment can be a conventional furnace operation, heating the overall semiconductor structure to a temperature lower than 650 degrees Celsius. In other embodiments, a thermal treatment can be a rapid thermal anneal (RTA) operation which sending a millisecond heat pulse to the semiconductor structure. The microwave irradiation can be applied to selectively heat the dielectric layer of the semiconductor structure at a frequency of 2.54 GHz under a power of 2.5KW for a duration below 10 minutes.

Referring to FIG. 6, the transforming operation 605 or 605' may be conducted after the first forming operation 601 or after the second forming operation 603. However, in some embodiments, performing the two transforming operations 605 and 605' is also within the contemplated scope of the present disclosure. Depending on the temperature of the thermal treatment, a suitable operation sequence may be determined. For example, if the temperature reached by a thermal treatment could potentially cause the interlayer diffusion in the metal gate layers, say over 1000 degrees Celsius, the transforming operation 605 shall be adopted before the formation of the metal gate layer. Accordingly, if the temperature reached by a thermal treatment does not generate serious stress in the wafer or cause interlayer diffusion in the metal gate layers, either of the transforming operations 605 and 605' can be adopted.

In FIG. 6, the transforming operation 605 or 605' transforms the dielectric layer from a first crystal phase to a second crystal phase. In some embodiments, the as-deposited high k dielectric layer is amorphous, and after the heat treatment and the microwave irradiation, the amorphous dielectric layer is transformed to a partially crystalline phase or a completely crystalline phase. It is understood that after the heat treatment the amorphous dielectric layer may be at least partially transformed to a first crystalline phase as a result of atomic rearrangement fostered by the annealing operation, and after the microwave irradiation the first crystalline phase is further transformed to a second crystalline phase. For example, an as-deposited $HfO_2$ layer is amorphous (k value 20), after a 650 degrees Celsius annealing operation, a portion of the amorphous $HfO_2$ layer turns into monoclinic (k value ~22), and another portion of the amorphous $HfO_2$ layer turns into cubic (k value 26). After a subsequent microwave irradiation selectively heating the partially crystallized $HfO_2$ layer, the $HfO_2$ layer is then transformed to tetragonal (k value 29). It can be seen that the former phase (i.e., amorphous or monoclinic) has a lower k value than that of the latter phase (i.e. cubic or tetragonal).

Figure 7:
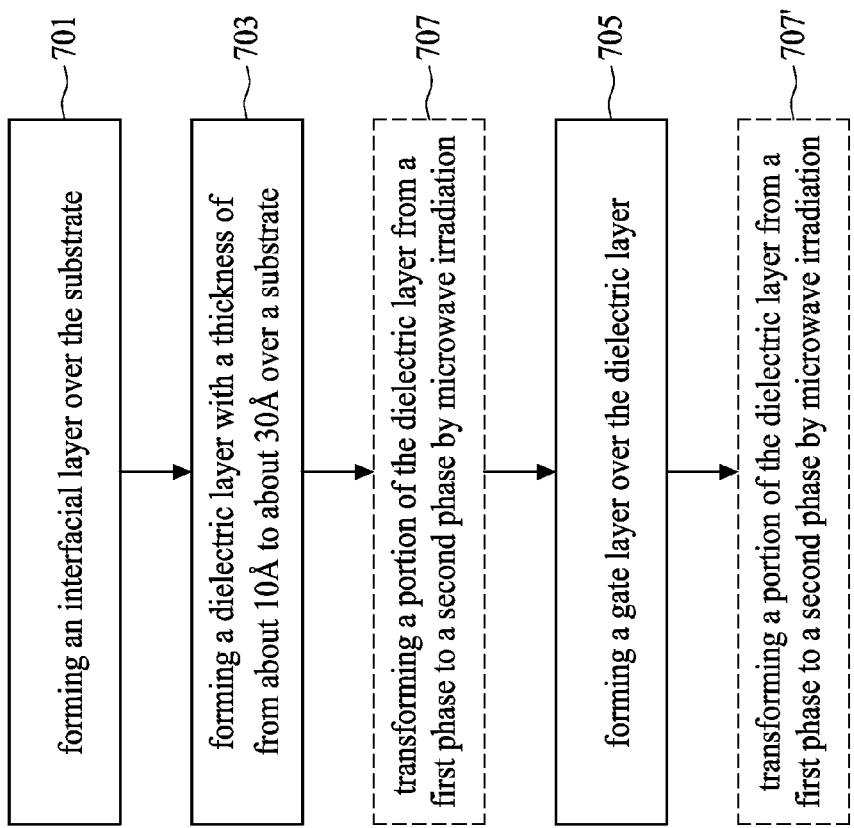
FIG. 7 shows operations in a method for manufacturing a semiconductor structure with a partially crystallized dielectric layer, in accordance with some embodiments of the present disclosure.

FIG. 7 shows operation procedures of a method for manufacturing a semiconductor structure. The method includes operation 701 forming an interfacial layer over the substrate, operation 703 forming a high k dielectric layer with a thickness of from about 10 Å to about 30 Å over a substrate, and operation 705 forming a gate layer over the dielectric layer. Operation 707 or 707' transforming at least a portion of the dielectric layer from a first phase to a second phase by microwave irradiation can be performed right after the dielectric formation, right after the gate layer formation, or both. The formation of the high k dielectric layer and the gate layer are previously discussed in the present disclosure referring to FIG. 6 and are not repeated here for simplicity.

Operation 701 forming an interfacial layer over a substrate can include any suitable process and any suitable thickness. In some embodiments, the interfacial layer may be formed by rapid thermal oxidation. Further in some embodiments, the interfacial layer 214 may be omitted entirely.

A difference between the operation shown in FIG. 7 and in FIG. 6 is that the operations in FIG. 6 has a transforming operation 605 and/or 605' involving both a thermal treatment (non-selective heating) and a microwave irradiation (selective heating), while the operations in FIG. 7 has a transforming operation 707 and/or 707' involving only a microwave irradiation (selective heating). The energy provided by microwave irradiation alone at particular frequency bands can effectively transform the crystal phase of a target dielectric material. The detailed operation conditions of the microwave irradiation are described in FIG. 13 to FIG. 15 of the present disclosure.

Figure 8:
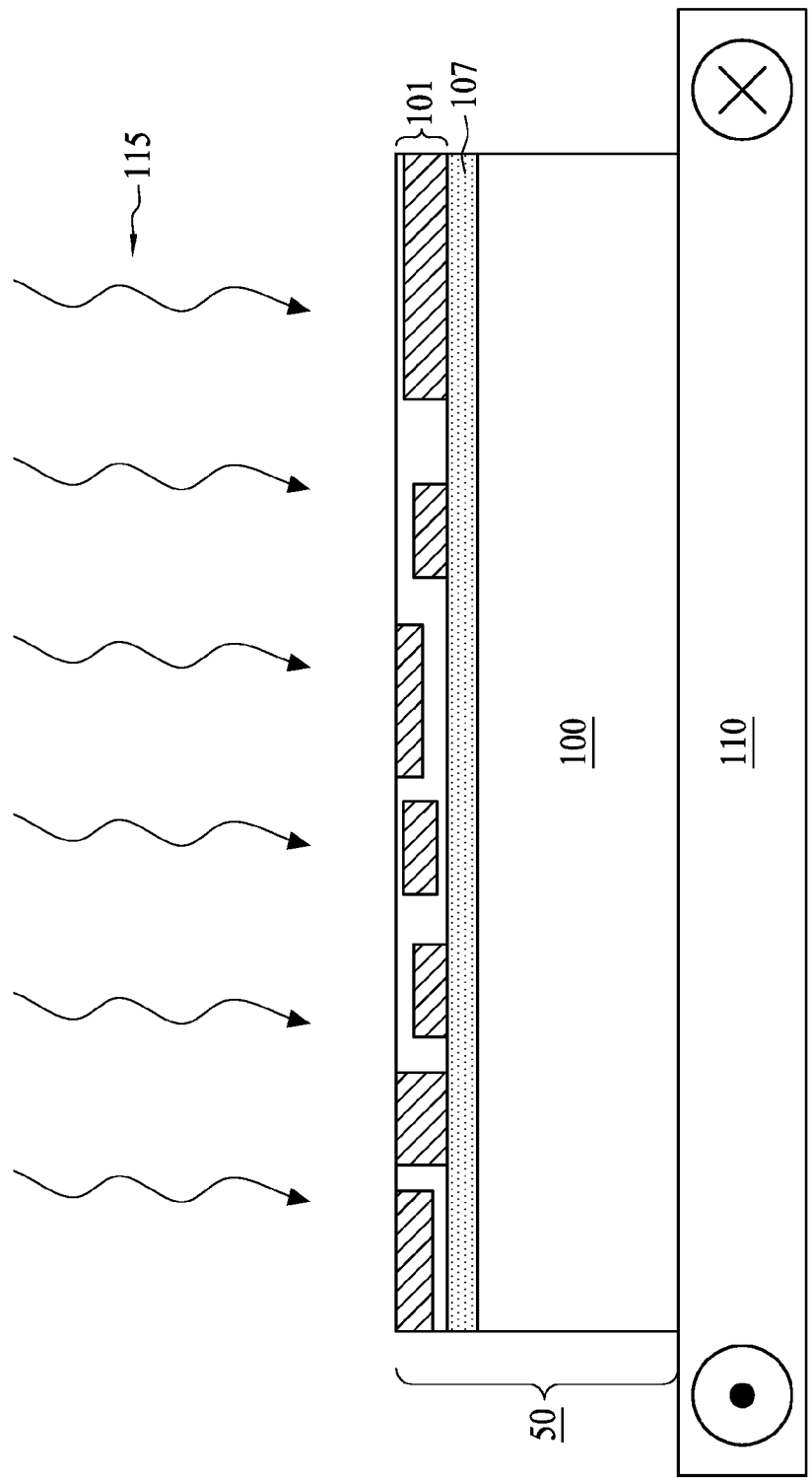
FIG. 8 to FIG. 12 show cross sectional views of operations in a method for manufacturing a semiconductor structure with a partially crystallized dielectric layer, in accordance with some embodiments of the present disclosure.
Figure 9:
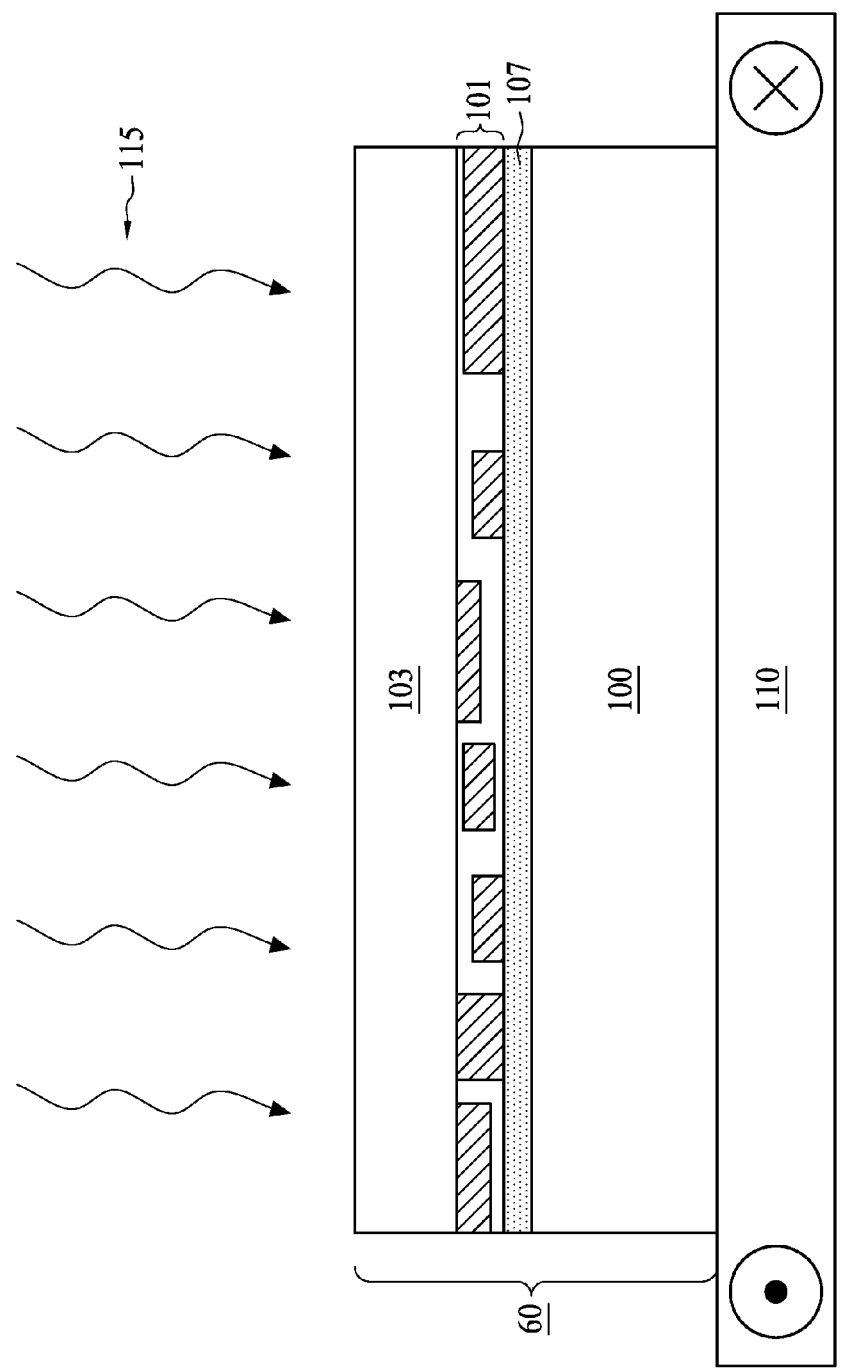
Figure 10:
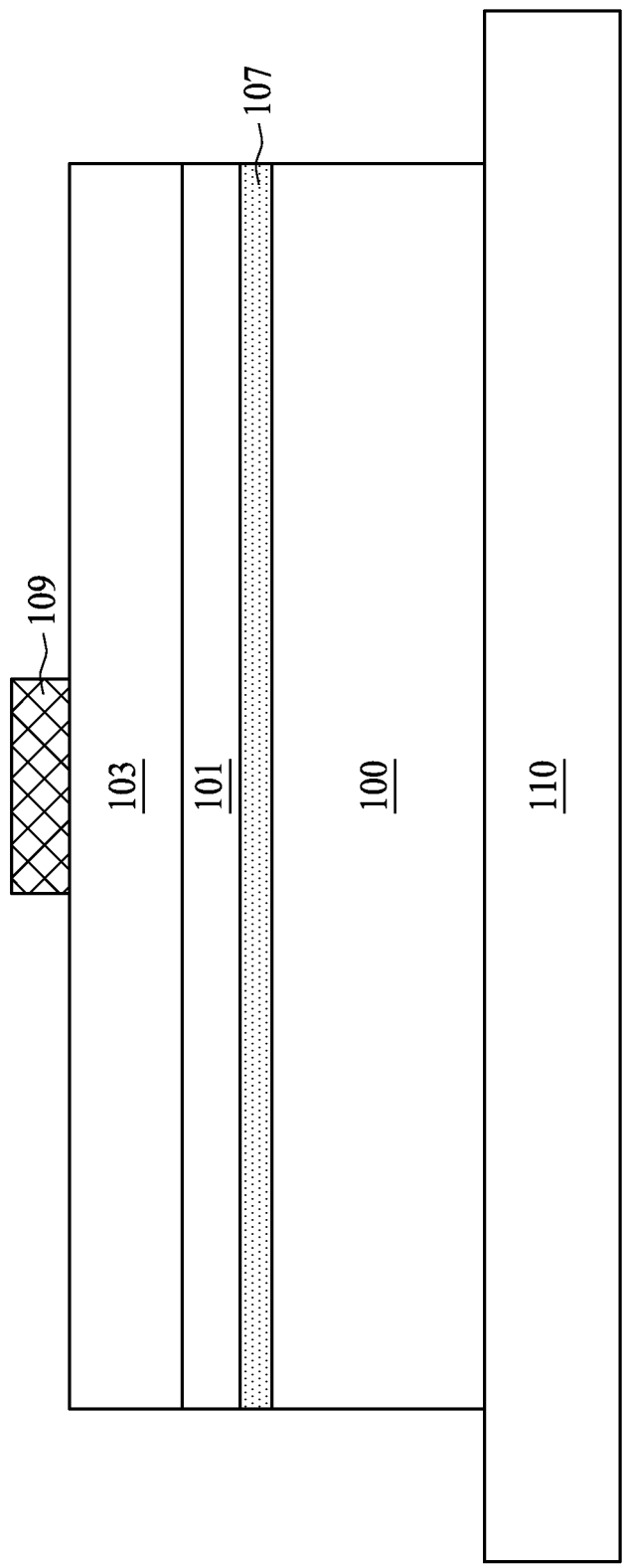
Figure 11:
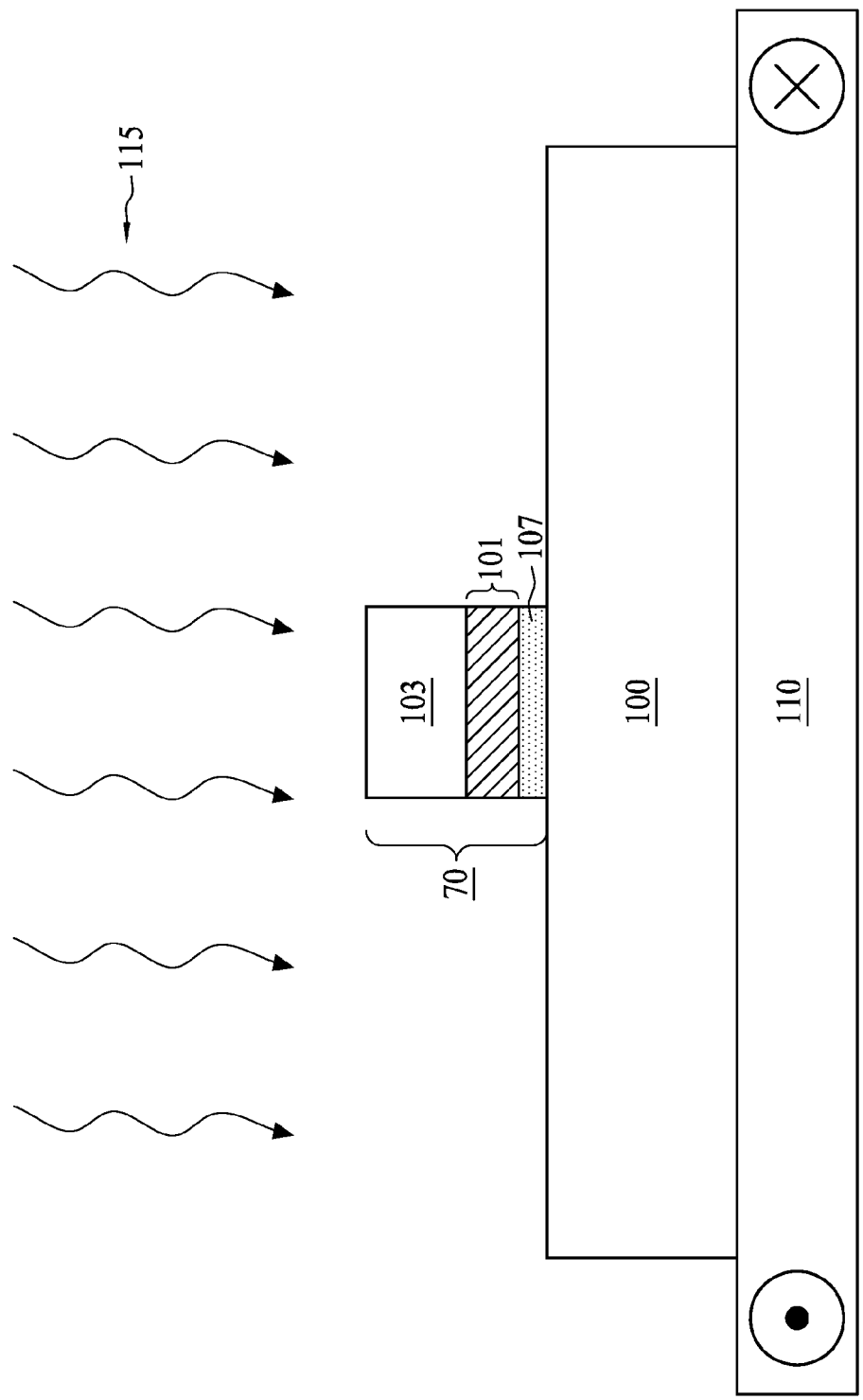
Figure 12:
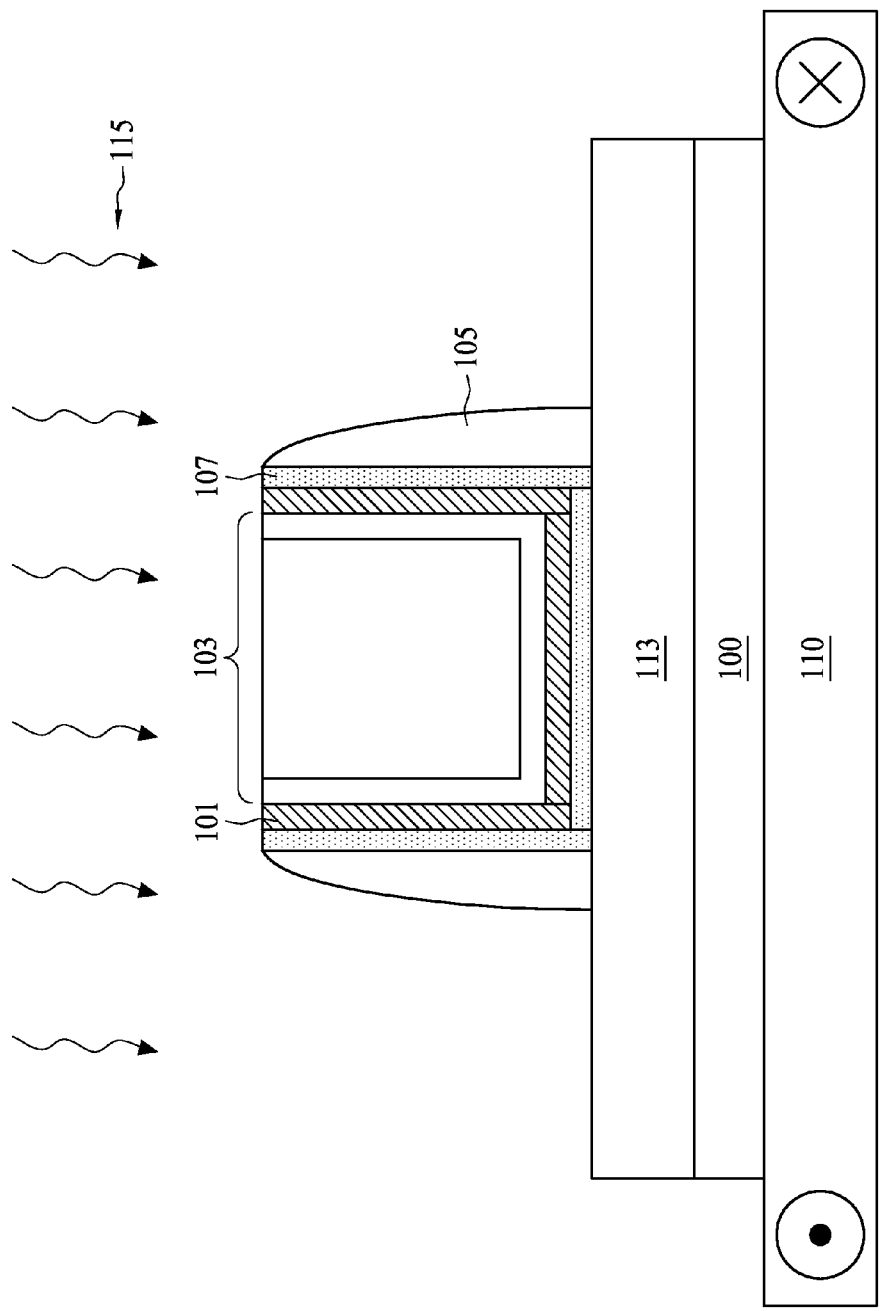

FIG. 8 to FIG. 12 show cross sectional views of operations in a method for manufacturing a semiconductor structure with a partially crystallized dielectric layer. FIG. 8 to FIG. 11 demonstrate different timing of microwave irradiation during the course of a polysilicon gate formation. FIG. 12 shows a microwave irradiation on a metal gate. In FIG. 8, an interfacial layer 107 and a high k dielectric layer 101 are formed on a substrate 100, and said semiconductor stack 50 is irradiated by microwave 115. In some embodiments, the energy of the microwave 115 induces partial crystallization (shaded portion in layer 101) in the high k dielectric layer 101. In some embodiments, the semiconductor stack 50 is further disposed on a wafer supporter 110 having a rotation speed lower than 20 rpm. Rotating the semiconductor stack 50 is to further provide a uniform irradiation effect of the microwave. In some embodiments, the semiconductor stack 50 is placed on a stationary wafer supporter 110 without any rotation. In FIG. 9, the microwave 115 can be irradiated upon a semiconductor stack 60 after the formation of the gate layer 103 but before the patterning of the gate stack. In FIG. 10, a hard mask 109 is formed on the gate layer 103 for the subsequent gate stack formation.

Following FIG. 10, a semiconductor gate stack 70 is formed by suitable etching operations and the microwave 115 is irradiated upon a patterned semiconductor stack 70 in FIG. 11. As shown in FIG. 11, the entire high k dielectric layer 101 turns into a crystalline structure (shaded area). In FIG. 12, the microwave 115 is applied on a metal gate after the formation of the gate layer 103 and the sidewall spacer 105. It is understood that since only the high k dielectric layer 101 is absorbing the microwave 115 and thus volumetrically heated, microwave 115 can be applied anytime during the course of the gate formation without affecting other layers. It is also understood that the microwave 115 can be irradiated from any angle with respect to the semiconductor structure since the absorption only occurs in the high k dielectric layer 101 and thus the microwave 115 is transparent to other layers of materials of the semiconductor structure and would not be attenuated.

Figure 13:
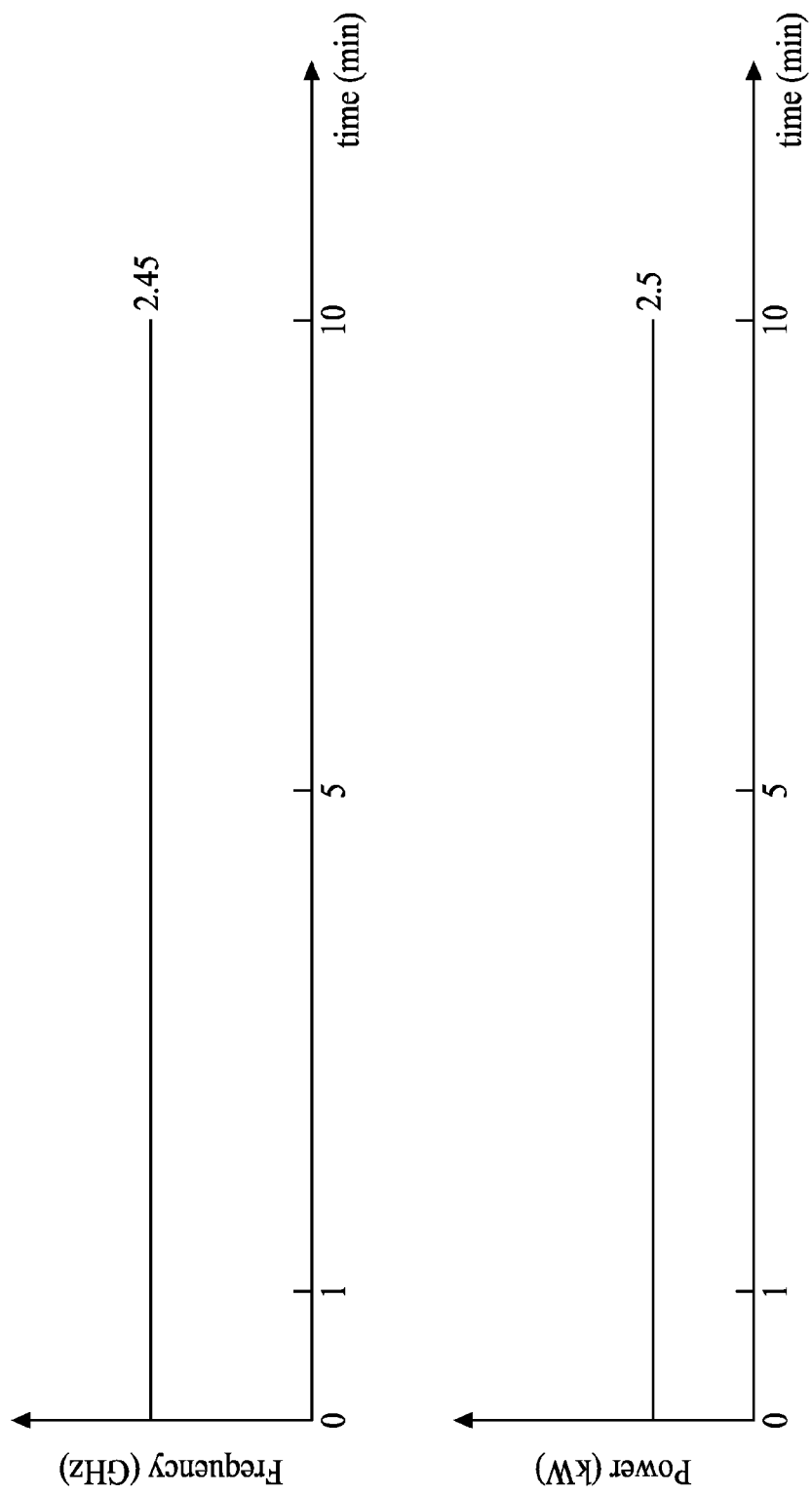
FIG. 13 shows conditions of the microwave frequency and the power during a course of a crystal phase transformation operation, in accordance with some embodiments of the present disclosure.
Figure 14:
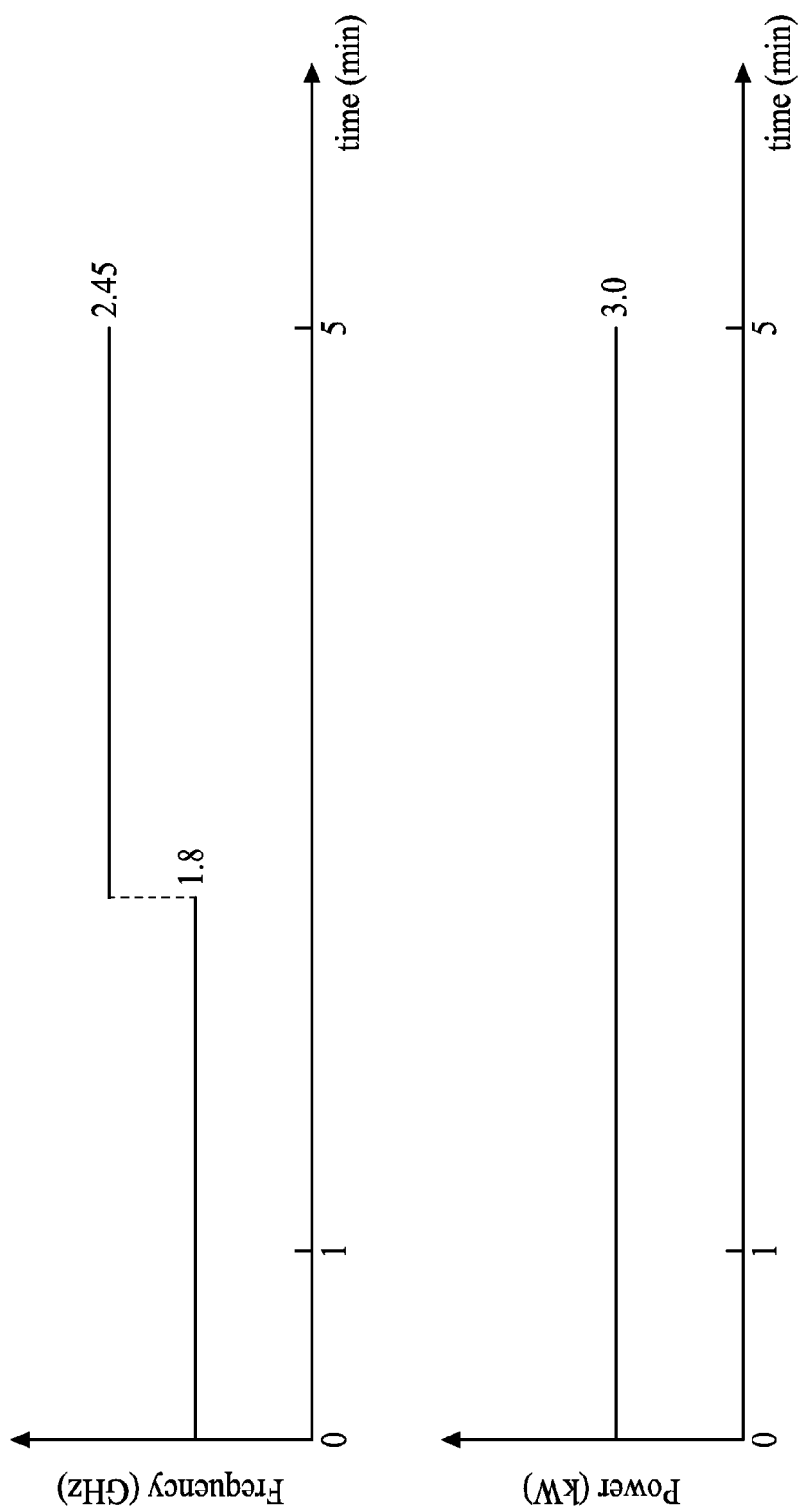
FIG. 14 shows conditions of the microwave frequency and the power during a course of a crystal phase transformation operation, in accordance with some embodiments of the present disclosure.
Figure 15:
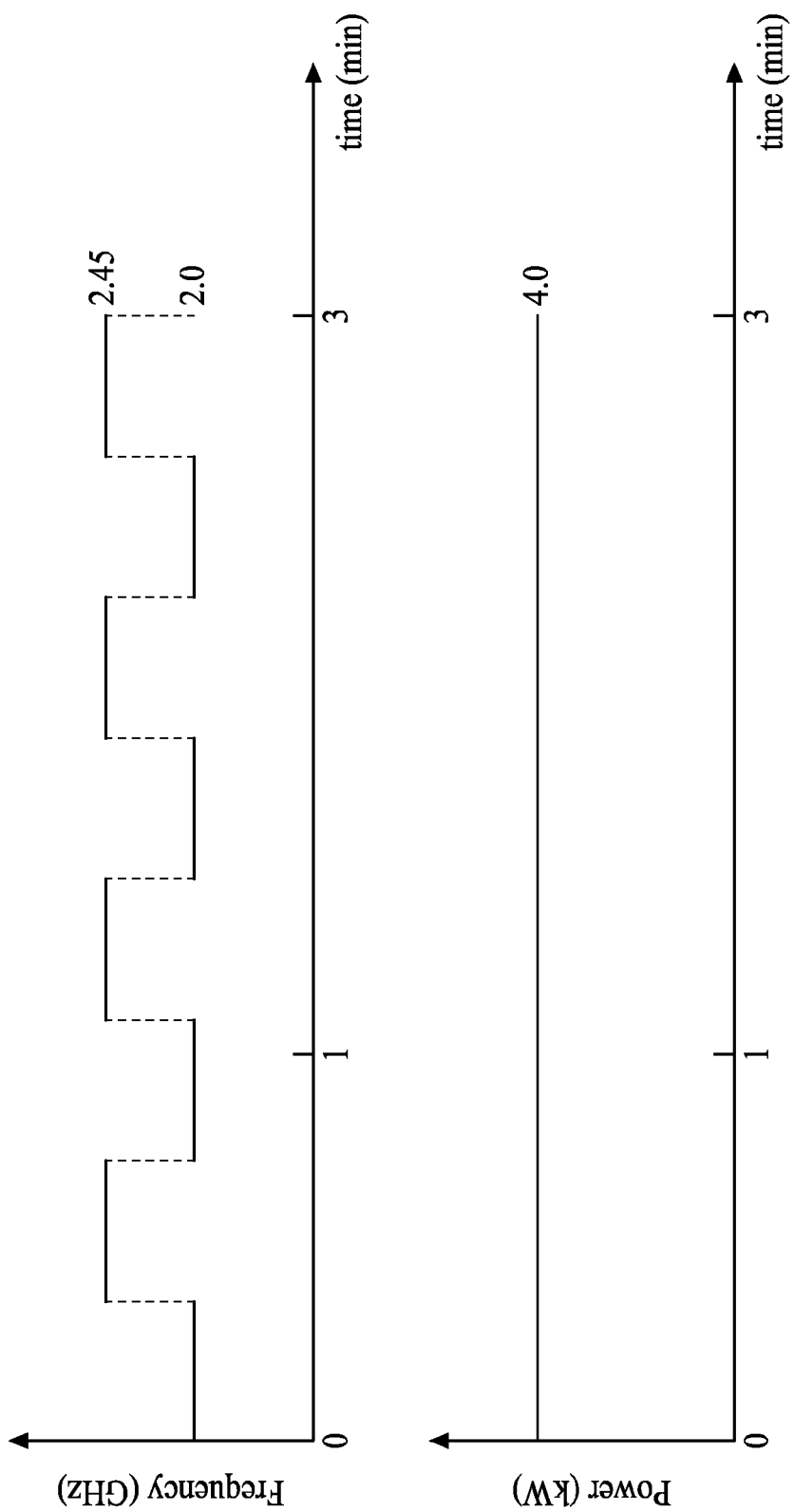
FIG. 15 shows conditions of the microwave frequency and the power during a course of a crystal phase transformation operation, in accordance with some embodiments of the present disclosure.

FIG. 13 to FIG. 15 show conditions of the microwave frequency and the microwave power during a course of a crystal phase transformation operation. The microwave frequency can be a fixed value or a varying value. The variation of the microwave frequency can be in a periodic fashion. The microwave frequency suitable for heating the high k dielectric layer shall possess a particular energy capable of inducing the boding rotation or vibration in the polar materials. In some embodiments, the microwave frequencies suitable for heating a high k dielectric layer is within a range of about 2.45±2.0 GHz under a range of microwave power 2.5±2.0KW.

In some embodiments of the present disclosure as shown in FIG. 13, the duration for microwave irradiation is about 10 minutes. During the course of the 10 minutes the microwave frequency is hold at a fixed value of 2.45 GHz under a stationary power of 2.5KW. In some embodiments of the present disclosure as shown in FIG. 14, the duration for microwave irradiation is about 5 minutes. During the first half of the 5 minutes the microwave frequency is hold at a fixed value of 1.8 GHz, whereas during the second half of the 5 minutes the microwave frequency is changed to hold at another fixed value of 2.45 GHz. At the mean time, the microwave power is hold at a fixed value of 2.5KW for the entire course of irradiation. In some embodiments of the present disclosure as shown in FIG. 15, the duration for microwave irradiation is about 3 minutes. The frequency of the microwave varies in a periodic fashion with a fluctuation range of 0.45 GHz. A high end of 2.45 GHz and a low end of 2.0 GHz are adopted accordingly. At the mean time, the microwave power is hold at a fixed value of 4.0KW for the entire course of irradiation.

Some embodiments of the present disclosure provide a semiconductor structure. The semiconductor structure includes a substrate, a high k dielectric layer disposed over the substrate, and a gate layer over the high k dielectric layer. The high k dielectric layer is partially crystallized and comprising an average thickness of from about 10 Å to about 30 Å.

In some embodiments of the present disclosure, the semiconductor structure further includes an interfacial layer between the substrate and the high k dielectric layer.

In some embodiments of the present disclosure, the interfacial layer of the semiconductor structure is amorphous.

In some embodiments of the present disclosure, the partially crystallized high k dielectric layer of the semiconductor structure includes monoclinic, cubic, or tetragonal crystal structure.

In some embodiments of the present disclosure, the high k dielectric layer of the semiconductor structure includes at least one of hafnium oxides, zirconium oxides, lanthanum oxides, titanium oxides, tantalum oxides, aluminum oxide, and the combination thereof.

In some embodiments of the present disclosure, the gate layer of the semiconductor structure includes doped semiconductor materials, metal nitrides, or metals.

Some embodiments of the present disclosure provide a method for manufacturing a semiconductor structure. The method includes (i) forming a dielectric layer with a thickness of from about 10 Å to about 30 Å over a substrate, (ii) forming a gate layer over the dielectric layer, and (iii) transforming a portion of the dielectric layer from a first phase to a second phase by microwave irradiation and thermal treatment.

In some embodiments of the present disclosure, the (i) forming the dielectric layer with a thickness of from about 10 Å to about 30 Å over the substrate of the method includes depositing an amorphous high k materials over the substrate.

In some embodiments of the present disclosure, the (ii) forming the gate layer over the dielectric layer includes forming a polysilicon gate or a metal gate.

In some embodiments of the present disclosure, the (iii) transforming a portion of the dielectric layer from a first phase to a second phase includes transforming the dielectric layer from an amorphous phase to a crystalline phase.

In some embodiments of the present disclosure, the (iii) transforming a portion of the dielectric layer from a first phase to a second phase includes transforming the dielectric layer from a monoclinic phase to a tetragonal phase.

In some embodiments of the present disclosure, the (iii) transforming a portion of the dielectric layer from a first phase to a second phase is performed prior to the (ii) forming the gate layer over the dielectric layer.

In some embodiments of the present disclosure, the (iii) transforming a portion of the dielectric layer from a first phase to a second phase by microwave irradiation and thermal treatment includes performing the operations under 650 degrees Celsius.

Some embodiments of the present disclosure provide a method for manufacturing a semiconductor structure. The method includes (i) forming a high k dielectric layer with a thickness of from about 10 Å to about 30 Å over a substrate, (ii) forming a gate layer over the dielectric layer, and (iii) transforming at least a portion of the dielectric layer from a first phase to a second phase by microwave irradiation.

In some embodiments of the present disclosure, the method further includes forming an interfacial layer over the substrate prior to the (i) forming the high k dielectric layer with a thickness of from about 10 Å to about 30 Å.

In some embodiments of the present disclosure, the (iii) transforming at least a portion of the dielectric layer from a first phase to a second phase is performed (a) between forming the high k dielectric layer and forming the gate layer, (b) after forming a gate layer, (c) after forming the interfacial layer and the high k dielectric layer, or (d) after forming the interfacial layer, the high k dielectric layer, and the gate layer.

In some embodiments of the present disclosure, the (iii) transforming at least a portion of the dielectric layer from a first phase to a second phase includes applying microwaves with a fixed frequency or varying frequencies.

In some embodiments of the present disclosure, the fixed frequency of the microwaves applied is about 2.45 GHz, and the varying frequencies of the microwaves applied are in a range of about 2.45±2.0 GHz.

In some embodiments of the present disclosure, the microwave power applied is in a range of about 2.5±2.0KW.

In some embodiments of the present disclosure, the (iii) transforming at least a portion of the dielectric layer from a first phase to a second phase by microwave irradiation includes transforming the dielectric layer from a lower k phase to a higher k phase.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
 a substrate;
 a high k dielectric layer over the substrate; and
 a gate layer over the high k dielectric layer;
 wherein the high k dielectric layer is partially crystallized and comprising an average thickness of from about 10 Å to about 30 Å, and
 wherein the high k dielectric layer is free of materials other than hafnium oxides.

2. The semiconductor structure of claim 1, wherein the partially crystallized high k dielectric layer comprises monoclinic, cubic, or tetragonal crystal structure.

3. The semiconductor structure of claim 1, wherein the high k dielectric layer is completely crystallized.

4. The semiconductor structure of claim 1, wherein the gate layer comprises doped semiconductor materials, metal nitrides, or metals.

5. The semiconductor structure of claim 1, further comprising an interfacial layer between the substrate and the high k dielectric layer.

6. The semiconductor structure of claim 5, wherein the interfacial layer is amorphous.

7. A method for manufacturing a semiconductor structure, comprising:
 forming a dielectric layer with a thickness of from about 10 Å to about 30 Å over a substrate;
 forming a gate layer over the dielectric layer; and
 transforming a portion of the dielectric layer from a first phase to a second phase by microwave irradiation and thermal treatment.

8. The method for manufacturing a semiconductor structure of claim 7, wherein the forming the dielectric layer with a thickness of from about 10 Å to about 30 Å over the substrate comprises depositing an amorphous high k materials over the substrate.

9. The method for manufacturing a semiconductor structure of claim 7, wherein the forming the gate layer over the dielectric layer comprises forming a polysilicon gate or a metal gate.

10. The method for manufacturing a semiconductor structure of claim 7, wherein the transforming a portion of the dielectric layer from a first phase to a second phase comprises transforming the dielectric layer from an amorphous phase to a crystalline phase.

11. The method for manufacturing a semiconductor structure of claim 7, wherein the transforming a portion of the dielectric layer from a first phase to a second phase comprises transforming the dielectric layer from a monoclinic phase to a tetragonal phase.

12. The method for manufacturing a semiconductor structure of claim 7, wherein the transforming a portion of the dielectric layer from a first phase to a second phase is performed prior to the forming the gate layer over the dielectric layer.

13. The method for manufacturing a semiconductor structure of claim 7, wherein the transforming a portion of the dielectric layer from a first phase to a second phase by microwave irradiation and thermal treatment comprises performing the operations under 650 degrees Celsius.

14. A method for manufacturing a semiconductor structure, the method comprising:
 forming a high k dielectric layer with a thickness of from about 10 Å to about 30 Å over a substrate;
 forming a gate layer over the dielectric layer; and
 transforming at least a portion of the dielectric layer from a first phase to a second phase by microwave irradiation.

15. The method for manufacturing a semiconductor structure of claim 14, further comprising forming an interfacial layer over the substrate prior to the forming the high k dielectric layer with a thickness of from about 10 Å to about 30 Å.

16. The method for manufacturing a semiconductor structure of claim 15, wherein the transforming at least a portion of the dielectric layer from a first phase to a second phase is performed (a) between forming the high k dielectric layer and forming the gate layer, (b) after forming a gate layer, (c) after forming the interfacial layer and the high k dielectric layer, or (d) after forming the interfacial layer, the high k dielectric layer, and the gate layer.

17. The method for manufacturing a semiconductor structure of claim 14, wherein the transforming at least a portion of the dielectric layer from a first phase to a second phase comprises applying microwaves with a fixed frequency or varying frequencies.

18. The method for manufacturing a semiconductor structure of claim 17, wherein the fixed frequency is about 2.45 GHz, and the varying frequencies are in a range of about 2.45±2.0 GHz.

19. The method for manufacturing a semiconductor structure of claim 17, wherein the microwave power is in a range of about 2.5±2.0KW.

20. The method for manufacturing a semiconductor structure of claim 14, wherein the transforming at least a portion of the dielectric layer from a first phase to a second phase by microwave irradiation comprises transforming the dielectric layer from a lower k phase to a higher k phase.

* * * * *